US008853812B2

(12) United States Patent
Okamoto et al.

(10) Patent No.: US 8,853,812 B2
(45) Date of Patent: Oct. 7, 2014

(54) PHOTODETECTOR, OPTICAL COMMUNICATION DEVICE EQUIPPED WITH THE SAME, METHOD FOR MAKING OF PHOTODETECTOR, AND METHOD FOR MAKING OF OPTICAL COMMUNICATION DEVICE

(75) Inventors: Daisuke Okamoto, Tokyo (JP); Junichi Fujikata, Tokyo (JP)

(73) Assignee: NEC Corporation, Tokyo (JP)

( * ) Notice: Subject to any disclaimer, the term of this patent is extended or adjusted under 35 U.S.C. 154(b) by 90 days.

(21) Appl. No.: 13/810,360

(22) PCT Filed: Jun. 15, 2011

(86) PCT No.: PCT/JP2011/064191
§ 371 (c)(1),
(2), (4) Date: Jan. 15, 2013

(87) PCT Pub. No.: WO2012/008272
PCT Pub. Date: Jan. 19, 2012

(65) Prior Publication Data
US 2013/0113064 A1 May 9, 2013

(30) Foreign Application Priority Data
Jul. 16, 2010 (JP) .................................. 2010-161707

(51) Int. Cl.
*H01L 31/036* (2006.01)
*H01L 31/105* (2006.01)
(Continued)

(52) U.S. Cl.
CPC ........ *G02B 6/12004* (2013.01); *H01L 31/1035* (2013.01); *G02B 6/4214* (2013.01);
(Continued)

(58) Field of Classification Search
None
See application file for complete search history.

(56) References Cited

U.S. PATENT DOCUMENTS 5,452,382 A * 9/1995 Shionoya et al. ............... 385/11
6,897,498 B2 * 5/2005 Gothoskar et al. ............ 257/226
(Continued)

FOREIGN PATENT DOCUMENTS

JP 2006-522465 A 9/2006
JP 2009-540611 A 11/2009

OTHER PUBLICATIONS

Luo, Xi. Transistor-Based Ge/SOI Photodetector for Integrated Silicon Photonics. Diss. University of California, 2011. Berkeley: Engineering-Electrical Engineering and Computer Sciences in the Graduate Division, 2011.*

(Continued)

*Primary Examiner* — Thomas L Dickey
*Assistant Examiner* — Joseph Schoenholtz
(74) *Attorney, Agent, or Firm* — McGinn IP Law Group, PLLC (57) ABSTRACT

The present invention provides a photodetector which solves the problem of low sensitivity of a photodetector, an optical communication device equipped with the same, and a method for making the photodetector, and a method for making the optical communication device. The photodetector includes a substrate, a lower cladding layer arranged on the substrate, an optical waveguide arranged on the lower cladding layer, an intermediate layer arranged on the optical waveguide, a optical absorption layer arranged on the intermediate layer, a pair of electrodes arranged on the optical absorption layer, and wherein the optical absorption layer includes a IV-group or III-V-group single-crystal semiconductor, and the optical absorption layer absorbs an optical signal propagating through the optical waveguide.

20 Claims, 9 Drawing Sheets

(51) Int. Cl.
　　　*H01L 21/205*　　(2006.01)
　　　*H01L 31/103*　　(2006.01)
　　　*G02F 1/00*　　　(2006.01)
　　　*G02B 6/12*　　　(2006.01)
　　　*G02B 6/42*　　　(2006.01)

(52) U.S. Cl.
　　　CPC ............... *G02F 1/00* (2013.01); *G02B 6/4246* (2013.01); *H01L 31/105* (2013.01)
　　　USPC .............. 257/458; 257/E31.04; 257/E21.003; 438/69; 385/14; 385/129; 385/130

(56) References Cited

U.S. PATENT DOCUMENTS

| | | | |
|---|---|---|---|
| 7,266,263 B2* | 9/2007 | Ahn et al. | 385/14 |
| 7,305,157 B2* | 12/2007 | Ahn et al. | 385/14 |
| 7,418,166 B1* | 8/2008 | Kapur et al. | 385/14 |
| 7,777,290 B2* | 8/2010 | Lagally et al. | 257/458 |
| 8,330,242 B2* | 12/2012 | Shiba et al. | 257/432 |
| 2004/0188794 A1 | 9/2004 | Gothoskar et al. | |
| 2007/0104410 A1* | 5/2007 | Ahn et al. | 385/14 |
| 2007/0104411 A1* | 5/2007 | Ahn et al. | 385/14 |
| 2007/0104441 A1* | 5/2007 | Ahn et al. | 385/129 |
| 2007/0284688 A1 | 12/2007 | Lagally et al. | |

OTHER PUBLICATIONS

International Search Report in PCT/JP2011/064191 dated Oct. 4, 2011 (English Translation Thereof).

J. S. Park et al., "Low-Defect-Density Ge Epitaxy on Si(001) Using Aspect Ratio Trapping and Epitaxial Lateral Overgrowth", Electrochemical and Solid-State Letters 12 p. 142 (2009).

\* cited by examiner

PHOTODETECTOR, OPTICAL COMMUNICATION DEVICE EQUIPPED WITH THE SAME, METHOD FOR MAKING OF PHOTODETECTOR, AND METHOD FOR MAKING OF OPTICAL COMMUNICATION DEVICE

TECHNICAL FIELD

The present invention relates to a photodetector and an optical communication device equipped with the same, and a method for making the photodetector and a method for making the optical communication device.

BACKGROUND ART

In recent years, it is expected that it is possible to realize a high performance and cheap optical interconnect device by manufacturing an optical integrated circuit using the process technology for a silicon Complementary Metal Oxide Semiconductor (CMOS) circuit. It is a photodetector that is in one of devices indispensable to the optical integrated circuit. The photodetector is desirable to be high-speed and sensitive, with short optical absorption length and small in size. From a point of view of the cost and yield, a photodiode using $Si_xGe_{1-x}$ ($0 \le x \le 1$) which can be monolithically integrated with a Si waveguide is considered promising.

For example, a waveguide detector using poly germanium stacked on a silicon on Insulator (SOI) substrate is disclosed in the patent literature 1.

Also, the nonpatent literature 1 discloses a process for forming a Ge layer having low defect density by performing selective epitaxial growth of a Ge layer in a trench part of $SiO_2$ film using a Si layer as an underlayer, and further performing lateral overgrowth of the Ge layer on the $SiO_2$ film.

Patent Literature 1: Japanese Patent Laid-Open Application Publication (Translation of PCT Application) No. 2006-522465 (paragraphs [0030], [0018], FIG. 5)

NonPatent Literature 1: J. S. Park et al., Low-Defect-Density Ge Epitaxy on Si(001) Using Aspect Ratio Trapping and Epitaxial Lateral Overgrowth, Electrochemical and Solid-State Letters 12 p. 142 (2009) (FIG. 1).

DISCLOSURE OF INVENTION

Problem to be Solved by the Invention

In the photodetector disclosed in patent literature 1, the defect density of the optical absorption layer is high because poly germanium used as the optical absorption layer has a polycrystalline structure. Therefore, there has been a problem that a dark current flowing between electrodes is large and the sensitivity of the photodetector is low.

Further, although the method for forming a Ge layer with low defect density is disclosed in nonpatent literature 1, it is not disclosed to apply this method to the process for making the photodetectors.

The object of the present invention is to provide a photodetector which solves the above mentioned problem of low sensitivity of photodetector, an optical communication device equipped with that, and a method for making the photodetector and a method for making the optical communication device.

Means for Solving a Problem

A photodetector of the present invention includes a substrate, a lower cladding layer arranged on the substrate, an optical waveguide arranged on the lower cladding layer, an intermediate layer arranged on the optical waveguide, a optical absorption layer arranged on the intermediate layer and a pair of electrodes arranged on the optical absorption layer, and wherein the optical absorption layer comprises a IV-group or III-V-group single-crystal semiconductor, and the optical absorption layer absorbs an optical signal propagating through the optical waveguide.

Also, a optical communication device of the present invention includes a photodetector, and wherein the photodetector includes a substrate, a lower cladding layer arranged on the substrate, an optical waveguide arranged on the lower cladding layer, an intermediate layer arranged on the optical waveguide, a optical absorption layer arranged on the intermediate layer and a pair of electrodes arranged on the optical absorption layer, and wherein the optical absorption layer comprises a IV-group or III-V-group single-crystal semiconductor, and the optical absorption layer absorbs an optical signal propagating through the optical waveguide.

Further, a method for making a photodetector of the present invention includes, making a crystal grow on a growth underlayer in a first element which includes a substrate, a lower cladding layer arranged on the substrate, an optical waveguide arranged on the lower cladding layer, an intermediate layer arranged on the optical waveguide, and the growth underlayer arranged on the substrate, to a direction nearly vertical to the growth underlayer, after the grown crystal having reached the height of the intermediate layer, forming a optical absorption layer on the intermediate layer by making a crystal grow to a direction nearly parallel to a surface of the intermediate layer, and forming a pair of electrodes on the optical absorption layer.

Further, a method for making an optical communication device of the present invention includes, forming an optical communication device using a photodetector made by making a crystal grow on a growth underlayer in a first element which includes a substrate, a lower cladding layer arranged on the substrate, an optical waveguide arranged on the lower cladding layer, an intermediate layer arranged on the optical waveguide, and the growth underlayer arranged on the substrate, to a direction nearly vertical to the growth underlayer, after the grown crystal having reached the height of the intermediate layer, forming a optical absorption layer on the intermediate layer by making a crystal grow to a direction nearly parallel to a surface of the intermediate layer, and forming a pair of electrodes on the optical absorption layer.

Effect of the Invention

According to the photodetector of the present invention, the photodetector can be made sensitive.

BRIEF DESCRIPTION OF THE DRAWINGS

FIGS. 3AI-3DI and FIGS. 3AII-3DII are figures showing a method for making the photodetector according to the first exemplary embodiment of the present invention, and are (AI) a cross-section view taken along the line 3AI-3AI in a plan view (AII) of an element in a prescribed process and (AII) a plan view, (BI) a cross-section view taken along the line 3BI-3BI in a plan view (BII) of the element in another process and (BII) a plan view, (CI) a cross-section view taken along the line 3CI-3CI in a plan view (CII) in further another process and (CII) a plan view, and (DI) a cross-section view taken along the line 3DI-3DI in a plan view (DII) in further another process and (DII) a plan view.

FIGS. 4AI-4DI and FIGS. 4AII-4DII are figures showing a method for making the photodetector according to the first exemplary embodiment of the present invention, and are (AI) a cross-section view taken along the line 4AI-4AI in a plan view (AII) of an element in a prescribed process and (AII) a plan view, (BI) cross-section view taken along the line 4BI-4BI in a plan view (BII) of the element in another process and (BII) a plan view, (CI) a cross-section view taken along the line 4CI-4CI in a plan view (CII) in further another process and (CII) a plan view, and (DI) a cross-section view taken along the line 4DI-4DI in a plan view (DII) in further another process and (DII) a plan view.

FIGS. 6AI-BI and FIGS. 6AII-6BII are figures showing a method for making the photodetector according to the second exemplary embodiment of the present invention, and are (AI) a cross-section view taken along the line 6AI-6AI in a plan view (AII) of an element in a prescribed process and (AII) a plan view, and (BI) a cross-section view taken along the line 6BI-6BI in a plan view (BII) of the element in another process and (BII) a plan view.

DESCRIPTION OF EMBODIMENTS

Next, the exemplary embodiments of the present invention will be described in detail with reference to drawings.

First Exemplary Embodiment

Figure 1A:
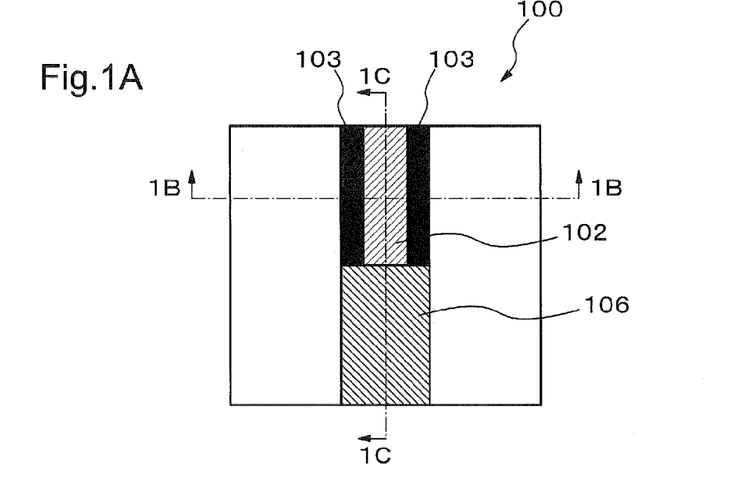
FIGS. 1A-1C are (A) a plan view of a photodetector according to a first exemplary embodiment of the present invention, (B) a cross-section view taken along the line 1B-1B in the plan view (A), and (C) a cross-section view taken along the line 1C-1C in the plan view (A).
Figure 1B:
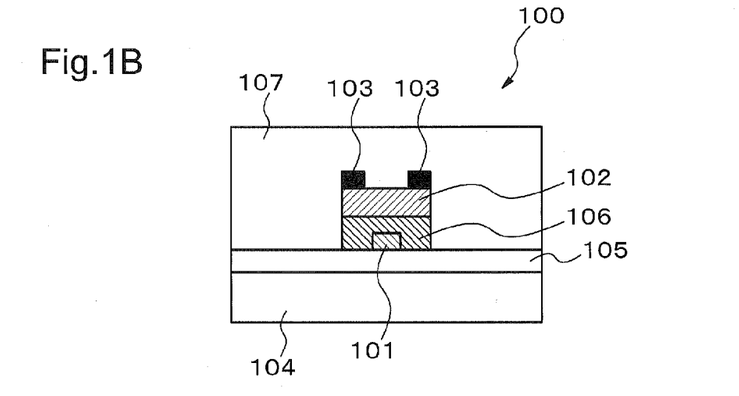
Figure 1C:
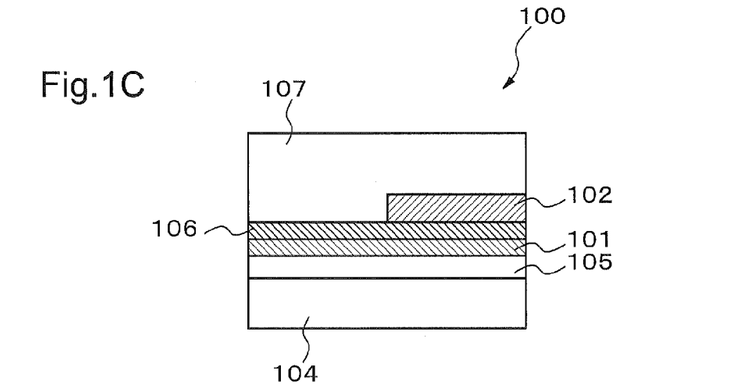

FIG. 1(A) is a plan view of a photodetector 100 according to a first exemplary embodiment of the present invention. FIG. 1(B) is a cross-section view taken along the line 1B-1B in the plan view of FIG. 1(A). FIG. 1(C) is a cross-section view taken along the line 1C-1C in the plan view of FIG. 1(A). Further, for convenience of explanation, an upper cladding layer 107 is not indicated in the figure of FIG. 1(A). As shown in FIGS. 1(B), (C), the photodetector 100 is provided with a substrate 104 made of Si and the like, a lower cladding layer 105 arranged on the substrate 104, and an optical waveguide 101 arranged on the lower cladding layer 105. As for the lower cladding layer 105, for example, $SiO_2$ can be used. Further, as for the optical waveguide 101, for example, Si can be used. Further, an intermediate layer 106 made of $SiO_2$ and the like is arranged on the optical waveguide 101. Further, a optical absorption layer 102 is arranged on the intermediate layer 106. Further, a pair of electrodes 103 is arranged on the optical absorption layer 102. The optical absorption layer 102 is made of single-crystal $Si_xGe_{1-x}$ (0≤x≤1). The optical absorption layer 102 absorbs an optical signal that propagates through the optical waveguide 101. The photodetector 100 has an upper cladding layer 107 which covers the electrodes 103 and the optical absorption layer 102.

In the photodetector 100 of this exemplary embodiment, the optical absorption layer 102 is made of single-crystal $Si_xGe_{1-x}$ (0≤x≤1). Therefore, the defect density of the optical absorption layer 102 provided for the photodetector 100 of this exemplary embodiment is lower than the defect density of the optical absorption layer which is formed by depositing polycrystalline germanium described in patent literature 1. As a result, in the photodetector 100 of this exemplary embodiment, it is possible to reduce a dark current arising between the electrodes 103 and to prevent the sensitivity of the photodetector 100 from decreasing. That is, the photodetector 100 can be made sensitive.

Further, according to the photodetector 100 of this exemplary embodiment, an impurity doped region becomes unnecessary at the portion where the optical waveguide 101 and the optical absorption layer 102 are optically connected. Therefore, it is possible to prevent an optical signal propagating through the optical waveguide 101 from being absorbed by impurities before reaching the optical absorption layer 102.

Also, the photodetector 100 according to this exemplary embodiment can achieve a strong optical confinement effect because the photodetector 100 is provided with the intermediate layer 106 made of $SiO_2$, whose refractive index is relatively small, under the optical absorption layer 102. As a result, the photodetector 100 can operate at high speed. Further, it is possible to shorten the absorption length of the light which is absorbed by the optical absorption layer.

In the above-mentioned description, although the materials of the substrate 104, the optical waveguide 101, and the optical absorption layer 102 are specified, each composition of the photodetector 100 according to this exemplary embodiment is not limited to these materials. The material used for each composition can be selected appropriately according to the purpose and the wavelength used, and for example, it is possible to use a IV-group semiconductor such as Si, Ge, C and Sn, or III-V-group semiconductor. Preferably in particular, it is desirable to use $Si_xGe_{1-x}$ (0≤x≤1), which can absorb the light with the optical communication wavelength band, for the optical absorption layer 102 with using the Si substrate 104 for which the standard silicon CMOS process can be used.

A bulk Si substrate may be used for the substrate 104, and an SOI substrate may also be used. For the lower cladding layer 105, the intermediate layer 106, and the upper cladding layer 107, it is desirable to use $SiO_2$, SiON, SiN and the like which have a high affinity for Si and $Si_xGe_{1-x}$, and in particular, it is desirable to use $SiO_2$ which can easily form a film with the stable state.

The composition ratio of Si and Ge which compose the optical absorption layer 102 may be determined appropriately in view of the wavelength of an incident light and deposition conditions. At that time, it is desirable to determine the composition ratio of Si and Ge which compose the optical absorption layer 102 so that the optical absorption layer 102 may have enough absorption coefficient to the incident light wavelength.

By controlling the composition ratio of Si and Ge which compose the optical absorption layer 102, it is possible to shorten the absorption length of the light. For example, if the optical communication wavelength band is used, it is possible to shorten the absorption length of the light by composing the optical absorption layer 102 using Ge only setting x at 0 in $Si_xGe_{1-x}$ ($0 \leq x \leq 1$).

It is desirable that the thickness of the intermediate layer 106 should be thinner, and in particular, it is desirable to make the thickness of the intermediate layer 106 almost equal to or thinner than that of the optical waveguide 101. As a result, it is possible to make an optical signal, which has propagated through the optical waveguide 101, shift to the optical absorption layer 102 with a short coupling length.

Further, in order to realize high-speed operation of the photodetector, it is desirable that an interval of a pair of electrodes 103 should be smaller, and more specifically, it is desirable to make it equal to or smaller than 1 μm.

The composition without the upper cladding layer 107 is also available for the photodetector 100. The upper cladding layer 107 has not only the function as a cladding but also the function as a protection film.

It is acceptable to remove the upper cladding layer 107 on the electrodes 103 by etching and the like. As a result, it is possible to connect electrically the electrodes 103 to an external circuit.

The photodetector 100 according to this exemplary embodiment may be an MSM (Metal-Semiconductor-Metal) type photodiode, and may also be a PIN (P-type-Intrinsic-N-type) type photodiode. In a case where the photodetector 100 is the MSM type photodiode, for the electrodes 103, it is desirable to use the metal which is used in the standard silicon CMOS process and forms high-quality Schottky junction with a semiconductor. Further, high-quality a plurality of metal materials, such as barrier metals and the metal to improve the adhesion to a semiconductor surface, are also available for the electrode 103. The photodetector 100 shown in FIG. 1 is a photodiode with an MSM structure in a lateral direction (horizontal direction) which is composed of one of the electrodes 103, the optical absorption layer 102, and the other of the electrodes 103.

Figure 2:
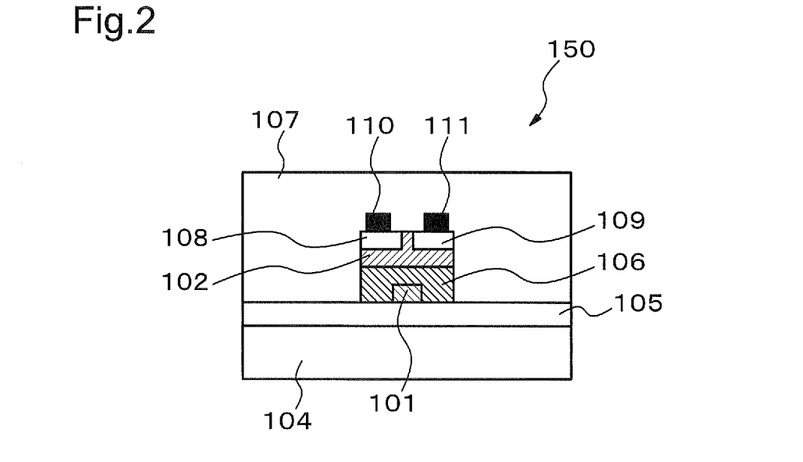
FIG. 2 is a cross-section view of another photodetector according to the first exemplary embodiment of the present invention.

An example of the case where the photodetector which is a PIN type photodiode will be described using FIG. 2. FIG. 2 is a cross-section view of the photodetector 150. The photodetector 150 has a PIN structure of the lateral direction (horizontal direction). The photodetector 150 is provided with the substrate 104, the lower cladding layer 105 arranged on the substrate 104, and the optical waveguide 101 arranged on the lower cladding layer 105. Further, the intermediate layer 106 is arranged on the optical waveguide 101. Further, the optical absorption layer 102 is arranged on the intermediate layer 106. Further, a p-type semiconductor 108 and an n-type semiconductor 109 are arranged on the optical absorption layer 102. Also, a p-electrode 110 is arranged on the p-type semiconductor 108, and an n-electrode 111 is arranged on the n-type semiconductor 109. Although it is possible to use Ge and the like as the material for the p-type semiconductor 108 and the n-type semiconductor 109, the material is not limited to those.

In the process for producing the PIN type photodiode, because of performing ion implantation in the neighborhood of the p-electrode 110 and the n-electrode 111, the process is more complicated than that for producing the MSM type photodiode. However, the PIN type photodiode can make a dark current smaller than that of the MSM type photodiode, and it can realize more stable operation.

The photodetector 100 according to this exemplary embodiment can be used as an optical receiver of an optical communication device. For example, by forming the photodetector of the present invention on a substrate, and further integrating an LSI electronic circuit on the same substrate monolithically, an optical interconnection module can be composed.

Figure 3:
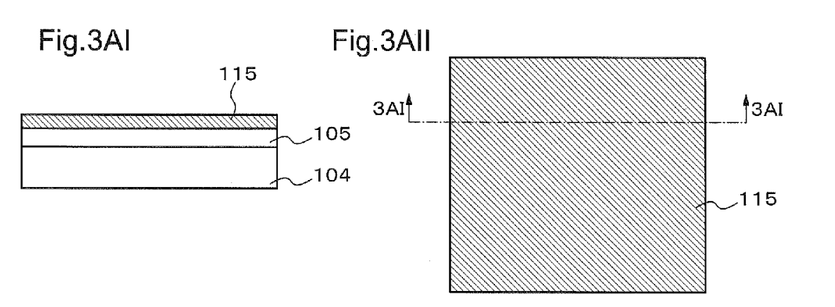

Next, a method for making the photodetector according to this exemplary embodiment will be described using FIG. 3 and FIG. 4. FIG. 3(AI)-FIG. 3(DI) and FIG. 4(AI)-FIG. 4(DI) are cross-section views of the photodetector in each production process. FIG. 3(AII)-FIG. 3(DII) and FIG. 4(AII)-FIG. 4(DII) are plan views of the photodetector in each production process. For convenience of explanation, the upper cladding layer 107 is not indicated in FIG. 3(AII)-FIG. 3(DII) and FIG. 4(AII)-FIG. 4(DII).

First, the lower cladding layer 105 is formed on the substrate 104, and the semiconductor layer 115 is formed on the formed lower cladding layer 105 (FIG. 3(AI) and FIG. 3(AII)). Further, an SOI substrate having such structure may be used.

Next, an optical waveguide 101 and a growth underlayer 113 are formed by etching the semiconductor layer 115 (FIG. 3(BI)). At this time, it is preferable to etch the semiconductor layer 115 so that the growth underlayer 113 may be arranged only in one area of edge sides of the optical waveguide 101 on the substrate (FIG. 3(BII)).

Next, the intermediate layer 106 is formed using the chemical vapor deposition method and the like (FIG. 3(CI) and FIG. 3(CII)).

Next, the intermediate layer 106 is planarized using the Chemical Mechanical Polishing (CMP) and the like (FIG. 3(DI) and FIG. 3(DII)).

Figure 4:
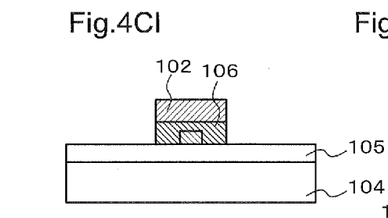

Next, the intermediate layer 106 on the area of the growth underlayer 113 is removed by etching and the like (FIG. 4(AI) and FIG. 4(AII)). An element in the state shown in FIG. 4(AI) and FIG. 4(AII) is called a first element.

Next, epitaxial growth of the growth underlayer 113 is performed using the chemical vapor deposition method and the like with $GeH_4$ and the like as source gas. As a result, first, on the growth underlayer 113, a longitudinal growth semiconductor layer 114 of a crystal grown in a longitudinal direction is formed. Here, the longitudinal direction means a direction nearly vertical to the growth underlayer 113. The crystal keeps growing even if the height of a growth front of the longitudinal growth semiconductor layer 114 becomes equal to the height of the intermediate layer 106. Then, the crystal also grows into the lateral direction of the longitudinal growth semiconductor layer 114. And, by the crystal grown into the lateral direction, the optical absorption layer 102 is formed on the intermediate layer 106 (FIG. 4(BI) and FIG. 4(BII)). Here, the lateral direction means a direction nearly parallel to a top surface of the intermediate layer 106. Also, it will be called longitudinal growth that the crystal grows into a longitudinal direction. And, it will be called lateral overgrowth that the crystal grows into a longitudinal direction and further grows into a lateral direction.

Next, the growth underlayer 113 and the longitudinal growth semiconductor layer 114 formed on the area of the growth underlayer are removed by etching and the like (FIG. 4(CI) and FIG. 4(CII)).

Finally, the electrodes 103 are formed on the optical absorption layer 102, and further the upper cladding layers 107 is formed (FIG. 4(DI) and FIG. 4(DII)).

According to the method for making the photodetector 100 of this exemplary embodiment, by forming the optical absorption layer 102 using the lateral overgrowth, the defect density in the optical absorption layer 102 can be made smaller. This is because by using the lateral overgrowth, it is possible to make the optical absorption layer 102 formed as a single crystal structure. As a result, it is possible to suppress a dark current arising between the electrodes 103 and to produce the high-sensitive photodetector 100.

Also, by forming the optical absorption layer 102 using the lateral overgrowth, easily, it is possible to make the optical absorption layer 102 optically connected to the optical waveguide 101 with a high degree of accuracy by self alignment. In the photodetector 100 produced in this way, by the evanescent coupling, an optical signal is transmitted from the waveguide 101 to the optical absorption layer 102 high-efficiently.

Further, by forming the optical absorption layer 102 using the lateral overgrowth, the defect density in the optical absorption layer 102 can be made smaller than the defect density of the optical absorption layer formed by using the longitudinal growth. This is because, for example, that if a crystal of SiGe is made to grow on the growth underlayer 113 made of Si, a lot of threading dislocations caused by the difference in the lattice constant between Si and SiGe are included in SiGe obtained by the longitudinal growth, on the other hand, few of the threading dislocations are included in SiGe obtained by the lateral overgrowth.

The intermediate layer 106 functions as a mask layer when forming the longitudinal growth semiconductor layer 114 using the chemical vapor deposition method and the like. Thus, by masking the optical waveguide 101 with the intermediate layer 106, on the upper part of the optical waveguide 101, without making $Si_xGe_{1-x}$ ($0 \leq x \leq 1$) grow into the longitudinal direction, it is possible to form the optical absorption layer 102, which has grown from the longitudinal growth semiconductor layer 114 into the lateral direction, on the intermediate layer.

Further, according to the method for making the photodetector 100 of this exemplary embodiment, the growth underlayer 113 and the longitudinal growth semiconductor layer 114 are removed by etching and the like. Therefore, the photodetector 100 does not include the growth underlayer 113 and the longitudinal growth semiconductor layer 114, and when using the photodetector 100, there is no case that an optical signal propagating through the optical waveguide 101 leaks out to the growth underlayer 113. Also, there is no case that the optical signal propagating through the optical waveguide 101 is absorbed by the longitudinal growth semiconductor layer 114. Therefore, the sensitivity of the photodetector 100 can be made higher.

Further, in the above-mentioned description, although the optical waveguide 101 and the growth underlayer 113 are formed from the same semiconductor layer 116, it is possible to form each independently. By forming the optical waveguide 101 and the growth underlayer 113 from the same semiconductor layer 116, the production process can be made simple.

The semiconductor material used for the growth underlayer 113 is not limited in particular, and it is also possible to use III-V-group semiconductors or IV-group semiconductors such as Si, Ge, C, Sn and the like.

As the semiconductor material used for the growth underlayer 113, for example, single crystal Si can be used. If single crystal Si is used for the growth underlayer 113, it is possible to obtain $Si_xGe_{1-x}$ ($0 \leq x \leq 1$) of high-quality single crystal structure. For example, it is possible to obtain single crystal Si and/or single crystal Ge by changing the composition ratio of the grown crystal through changing the ratio of the gas to be used at the time of growth.

In the above-mentioned description, although it has described about the process for producing the photodetector 100 in which the optical absorption layer 102 is composed of a single crystal structure using the semiconductor material having a single crystal structure as the growth underlayer 113, the growth underlayer 113 and the optical absorption layer 102 are not limited to a single crystal structure. For example, it is also possible to form the optical absorption layer with a polycrystalline structure or an amorphous structure using polycrystalline Si or amorphous Si as the growth underlayer. Also, in this case, by forming the optical absorption layer with a polycrystalline structure or an amorphous structure using the lateral overgrowth, the defect density in the optical absorption layer can be made smaller than that of the optical absorption layer with a polycrystalline structure or an amorphous structure formed using the longitudinal growth. This is because, for example, that if a crystal of SiGe is made to grow on the growth underlayer 113 made of Si, a lot of threading dislocations caused by the difference in the lattice constant between Si and SiGe are included in SiGe obtained by the longitudinal growth, on the other hand, few of the threading dislocations are included in SiGe obtained by the lateral overgrowth. Because a dark current arising between the electrodes can be suppressed by reducing the defect density in the optical absorption layer, it is possible to produce a high-sensitivity photodetector by the method for making the photodetector according to this exemplary embodiment.

Second Exemplary Embodiment

Figure 5A:
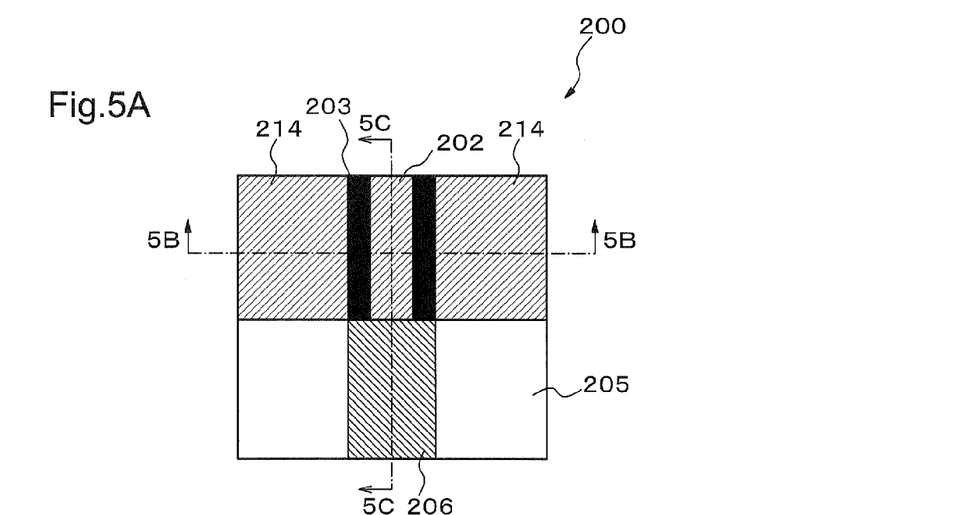
FIGS. 5A-5C are (A) a plan view of a photodetector according to a second exemplary embodiment of the present invention, (B) a cross-section view taken along the line 5B-5B in the plan view (A), and (C) a cross-section view taken along the line 5C-5C in the plan view (A).
Figure 5B:
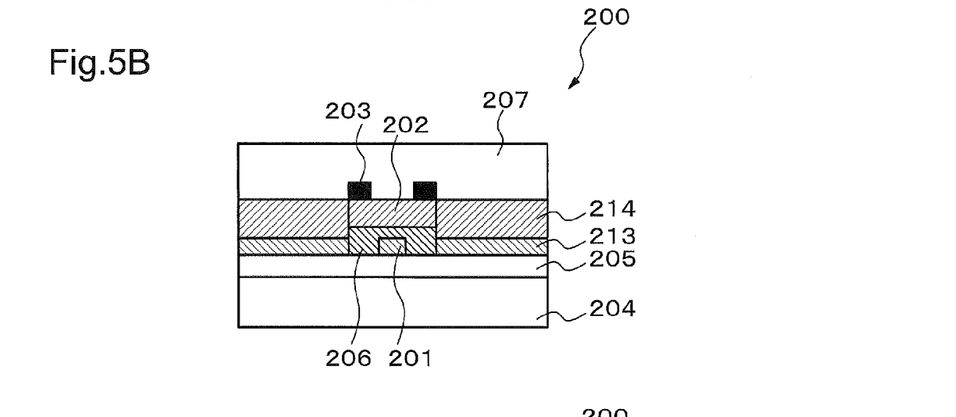
Figure 5C:
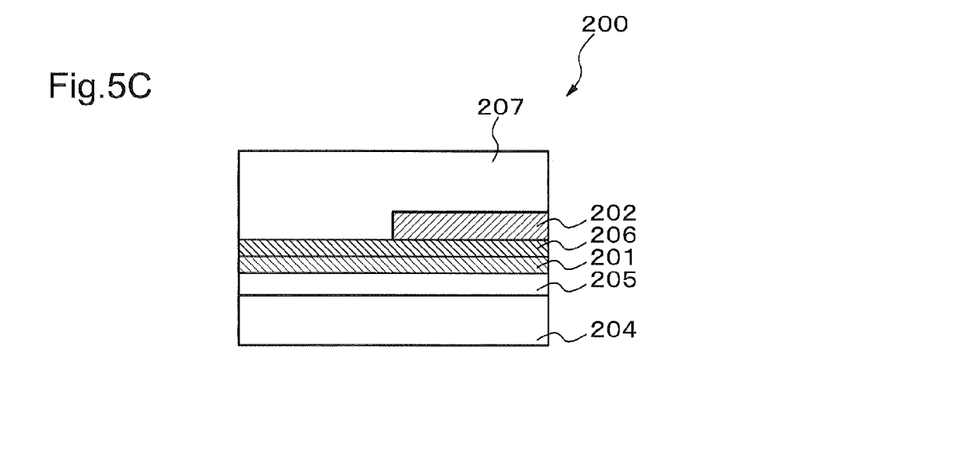

Next, a photodetector 200 of a second exemplary embodiment of the present invention will be described. FIG. 5(A) is a plan view of the photodetector 200 according to the second exemplary embodiment of the present invention. FIG. 5(B) is a cross-section view taken along the line 5B-5B in the plan view of FIG. 5(A). For convenience of explanation, an upper cladding layer 207 is not indicated in the figure of FIG. 5(A). FIG. 5(C) is a cross-section view taken along the line 5C-5C in the plan view of FIG. 5(A). As shown in FIG. 5(B), FIG. 5(C), the photodetector 200 is provided with a substrate 204, a lower cladding layer 205 arranged on the substrate 204, and an optical waveguide 201 arranged on the lower cladding layer 205. Further, an intermediate layer 206 is arranged on the optical waveguide 201. Further, an optical absorption layer 202 is arranged on the intermediate layer 206. Further, a pair of electrodes 203 is arranged on the optical absorption layer 202. The optical absorption layer 202 is made of a IV-group or III-V-group single-crystal semiconductor. The optical absorption layer 202 absorbs an optical signal propagating through the optical waveguide 201. The photodetector 200 includes an upper cladding layer 207 which covers the electrodes 203 and the optical absorption layer 202.

Further, the photodetector 200 is provided with a growth underlayer 213 arranged on the lower cladding layer 205 and a longitudinal growth semiconductor layer 214 arranged on the growth underlayer 213.

According to the photodetector 200 of this exemplary embodiment, the optical absorption layer 202 is made of a IV-group or III-V-group single-crystal semiconductor. Therefore, the defect density of the optical absorption layer 202 provided for the photodetector 200 of this exemplary embodiment is lower. As a result, in the photodetector 200 of this exemplary embodiment, it is possible to reduce a dark current arising between the electrodes 203, and to prevent the sensitivity of the photodetector 200 from decreasing.

Next, a method for making the photodetector according to this exemplary embodiment will be described using FIG. 6.

Figure 6:
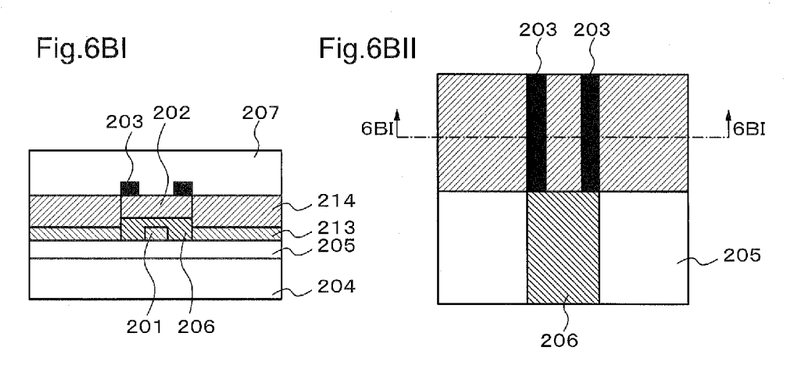

FIG. 6(AI)-FIG. 6(BI) are cross-section views of the photodetector in each production process. FIG. 6(AII)-FIG. 6(BII) are plan views of the photodetector in each production process. For convenience of explanation, the upper cladding layer 207 is not indicated in the figures of FIG. 6(AII)-FIG. 6(BII).

First, the photodetector shown in FIG. 6(AI), FIG. 6(AII) is prepared. Because the process for producing this photodetector is the same as the process for producing the photodetector described using FIG. 3(AI)-FIG. 3(DI) and FIG. 4(AI)-FIG. 4(BI) in the first exemplary embodiment, its description will be omitted.

Next, the electrodes 203 are formed on the optical absorption layer 202, and further the upper cladding layers 207 are formed (FIG. 6(BI), FIG. 6(BII)).

In the process for producing the photodetector according to this exemplary embodiment, the number of production process is smaller compared with the method for making the photodetector according to the first exemplary embodiment. This is because while removing the growth underlayer 113 and the longitudinal growth semiconductor layer 114 by etching and the like in the method for making the photodetector according to the first exemplary embodiment (FIG. 4(CI)), this removal process is omitted in this exemplary embodiment. In other words, in the production process of this exemplary embodiment, the growth underlayer 213 and the longitudinal growth semiconductor layer 214 are not removed by etching and the like. Therefore, in the method for making the photodetector according to this exemplary embodiment, the number of production process decreases, and it is possible to produce the photodetector with lower cost using this production process.

Although the above-mentioned description has shown the method for making the photodetector 100 in which the optical absorption layer 102 has a single crystal structure and semiconductor material of a single crystal structure is used as the growth underlayer 113, the growth underlayer 113 and the optical absorption layer 102 are not limited to a single crystal structure. That is, it is possible to obtain the optical absorption layer of a polycrystalline structure or an amorphous structure using a IV-group or III-V-group semiconductor having a polycrystalline structure or an amorphous structure as the growth underlayer 213.

Third Exemplary Embodiment

Figure 7A:
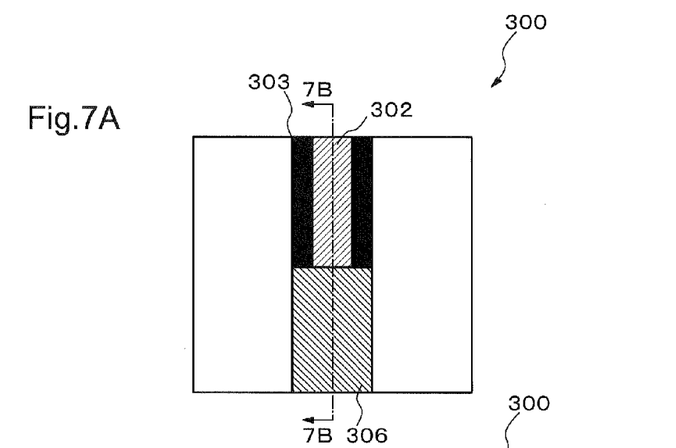
FIG. 7A and FIG. 7B are (A) a plan view of a photodetector according to a third exemplary embodiment of the present invention and (B) a cross-section view taken along the line 7B-7B in the plan view (A).
Figure 7B:
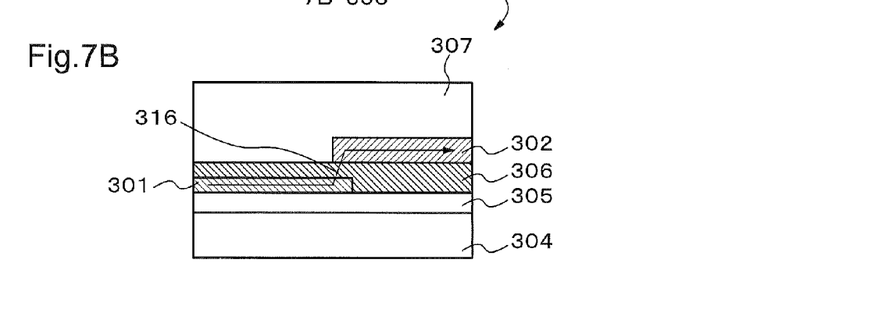

Next, a third exemplary embodiment of the present invention will be described using FIG. 7. FIG. 7(A) is a plan view of a photodetector 300 according to the third exemplary embodiment of the present invention. FIG. 7(B) is a cross-section view taken along the line 7B-7B in the plan view of FIG. 7(A). For convenience of explanation, the upper cladding layer 307 is not indicated in the figure of FIG. 7(A). As shown in FIGS. 7(A) and 7(B), the photodetector 300 is provided with a substrate 304, a lower cladding layer 305 arranged on the substrate 304, and an optical waveguide 301 arranged on the lower cladding layer 305. Further, an intermediate layer 306 is arranged on the optical waveguide 301. Further, an optical absorption layer 302 is arranged on the intermediate layer 306. Further, a pair of electrodes 303 is arranged on the optical absorption layer 302. The optical absorption layer 302 is made of a IV-group or III-V-group semiconductor having a single crystal structure. The optical absorption layer 302 absorbs an optical signal 316 propagating through the optical waveguide 301. The photodetector 300 includes the upper cladding layer 307 which covers the electrodes 303 and the optical absorption layer 302.

Further, as shown in FIG. 7(B), only an edge portion of the optical absorption layer 302 is arranged on the optical waveguide 301 interleaved with the intermediate layer 306.

According to the photodetector 300 according to this exemplary embodiment, because only an edge portion of the optical absorption layer 302 is arranged on the optical waveguide 301 interleaved with the intermediate layer 306, it is possible to prevent an optical signal 316, which has transferred from the optical waveguide 301 to the optical absorption layer 302, from returning to the optical waveguide 301, and the optical absorption length can be made shorter.

Fourth Exemplary Embodiment

Figure 8:
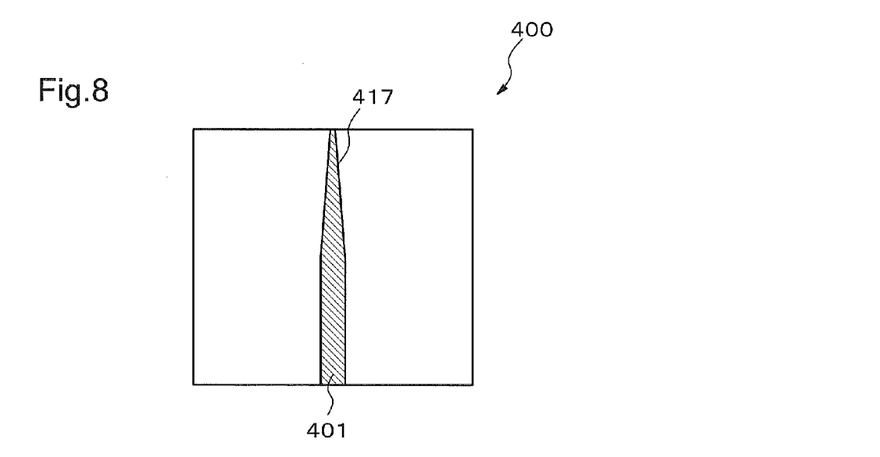
FIG. 8 is a cross-section view of a photodetector according to a fourth exemplary embodiment of the present invention.

Next, a fourth exemplary embodiment of the present invention will be described using FIG. 8. A plan view of a photodetector 400 according to the fourth exemplary embodiment of the present invention is shown in FIG. 8. The photodetector 400 is provided with, just like the photodetector according to the first exemplary embodiment, a substrate, a lower cladding layer, an intermediate layer, an optical waveguide, a optical absorption layer, a pair of electrodes, and an upper cladding layer. For convenience of explanation, the upper cladding layer, the intermediate layer, the optical absorption layer, and the electrodes are not indicated in the figure of FIG. 8.

The photodetector 400 has a taper structure 417 at an edge portion of the optical waveguide 401, and this taper structure 417 is arranged under the optical absorption layer interleaved with the intermediate layer. For this reason, it is possible to reduce the reflection and the scattering of the light at an optical coupling part of the optical waveguide 401 and the optical absorption layer, and the sensitivity of the photodetector can be made higher.

Although in the example shown in FIG. 8, the optical waveguide 401 having the taper structure 417 is arranged over a span of one end of the substrate to the other end, it is also available to arrange only an edge portion of the taper structure 417 under the optical absorption layer just like the third exemplary embodiment in which the length of the optical waveguide 401 is shortened against the distance between one end of the substrate and the other end.

Fifth Exemplary Embodiment

Figure 9:
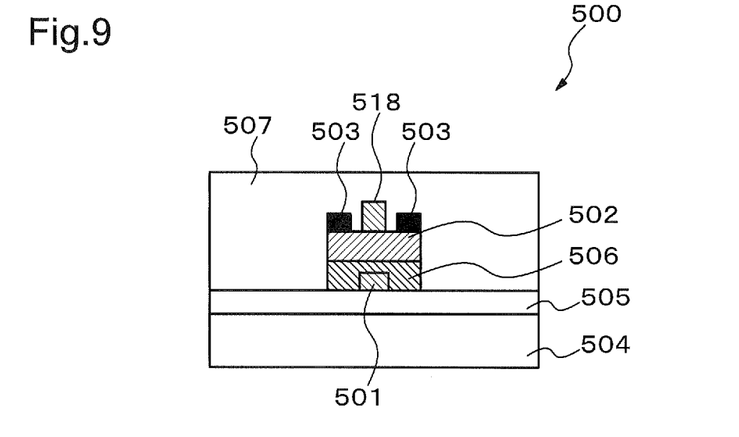
FIG. 9 is a cross-section view of a photodetector according to a fifth exemplary embodiment of the present invention.

Next, a fifth exemplary embodiment of the present invention will be described using FIG. 9. FIG. 9 is a cross-section view of a photodetector 500 according to the fifth exemplary embodiment of the present invention. The photodetector 500 is provided with, just like the photodetector according to the first exemplary embodiment, a substrate 504, a lower cladding layer 505, an intermediate layer 506, an optical waveguide 501, a pair of electrodes 503, an optical absorption layer, and an upper cladding layer 507.

Further, an $Si_yGe_{1-y}$ ($0 \leq y \leq 1$, $y \neq x$) layer 518 is arranged on the optical absorption layer 502. The $Si_yGe_{1-y}$ ($0 \leq y \leq 1$, $y \neq x$) layer 518 has the composition in which the light propagating through the optical absorption layer 502 is not absorbed due, to its wavelength. Thus, by arranging the $Si_yGe_{1-y}$ ($0 \leq y \leq 1$, $y \neq x$) layer 518 on the optical absorption layer 502, it is possible to reduce the proportion of the light which is absorbed by the electrodes 503, and the sensitivity of the photodetector can be made higher.

Because the $Si_yGe_{1-y}$ ($0 \leq y \leq 1$, $y \neq x$) layer 518 may be made of the material which has a larger refractive index than that of the upper cladding layer, for example, a SiN layer may be used instead of the $Si_yGe_{1-y}$ ($0 \leq y \leq 1$, $y \neq x$) layer 518. However, since the $Si_yGe_{1-y}$ (0≤y≤1, y≠x) layer 518 has the larger refractive index, it is preferable to use the $Si_yGe_{1-y}$ (0≤y≤1, y≠x) layer.

Sixth Exemplary Embodiment

Figure 10:
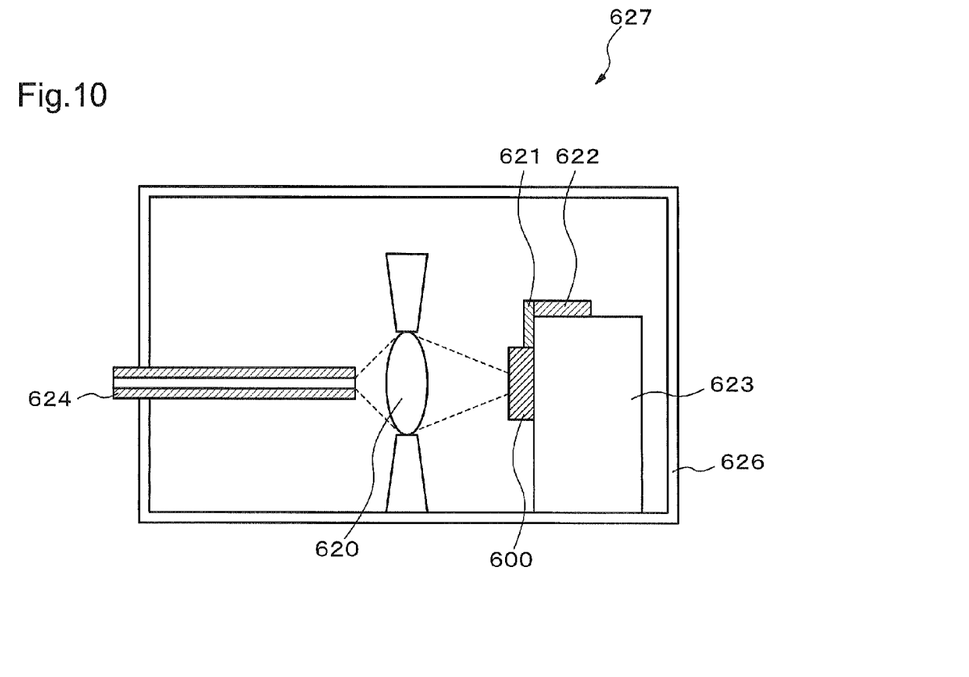
FIG. 10 is a cross-section view of an optical communication device according to a sixth exemplary embodiment of the present invention.

Next, a sixth exemplary embodiment of the present invention will be described using FIG. 10. FIG. 10 is a cross-section view of an optical communication device 627 for 40 Gbps transmission equipped with a photodetector 600. The photodetector 600 is mounted on a chip carrier 623 arranged in the module case 626. The photodetector 600 is optically connected to an optic fiber 624 and a lens 620. Further, the photodetector 600 is electrically connected to a pre-amplifier IC through an electric wiring 621.

According to this exemplary embodiment, since the optical communication device 627 is equipped with the high-sensitive photodetector 600, it is possible to improve the performance of the optical communication device 627.

Seventh Exemplary Embodiment

Figure 11:
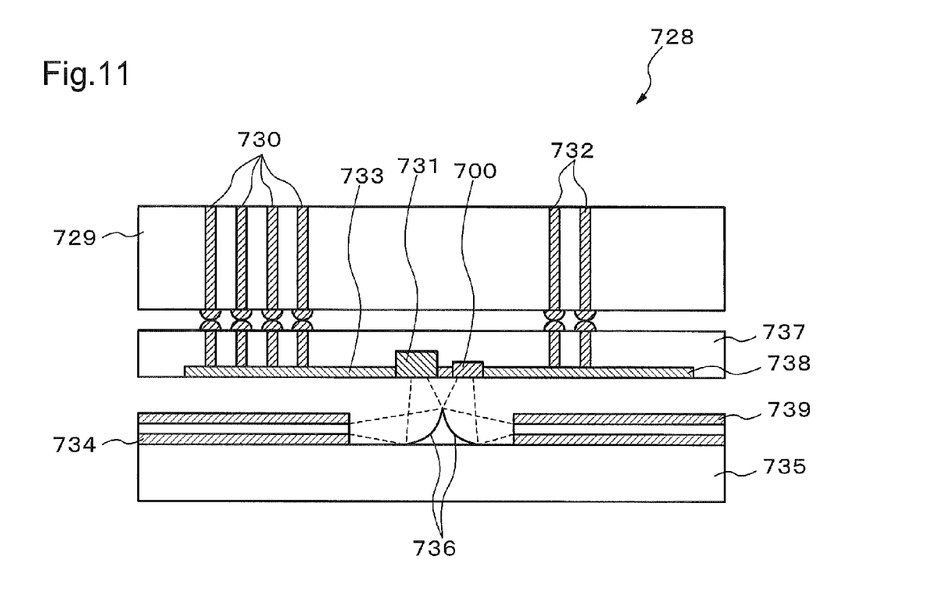
FIG. 11 is a cross-section view of an optical communication device according to a seventh exemplary embodiment of the present invention.

Next, a seventh exemplary embodiment of the present invention will be described using FIG. 11. FIG. 11 is a cross-section view of an optical communication device equipped with a photodetector 700. This optical communication device is an inter-chip connection module 728. The photodetector 700 is irradiated by a concave mirror 736 with an optical signal from an optical signal input fiber 739 mounted on the first mounting board 735. After that, the optical signal is transmitted through an electric wiring layer for photodiode 738. And, an electric current depending on the optical signal flows into an LSI mounted on an LSI package 729. The electric wiring layer for photodiode 738 is electrically connected to an electric wiring via for photodiode 732 in the LSI package 729. Here, instead of the optical fiber for inputting the optical signal, it is also possible to use other method which is generally known such as a planar optical waveguide. Further, instead of the concave mirror 736, it is also possible to use a light collection structure such as a convex lens. Further, it is also possible to arrange a pre-amplifier for amplifying electric signal in the electric wiring layer for photodiode 738 which is located just behind the photodiode.

An electric signal from LSI passes from an electric wiring via for a light source and modulation 730 through an electric wiring layer for a light source and modulation 733 mounted on the second mounting board 737, and is converted into an optical signal by a VCSEL (Vertical Cavity Surface Emitting Laser; surface emission-type laser) light source 731 equipped with an electric modulation system. This optical signal is reflected by the concave mirror 736, and is sent to an optical signal output fiber 734. Instead of the VCSEL light source 731 equipped with an electric modulation system, it is also possible to use other system which electrically modulates an optical signal, for example, a Mach-Zehnder type modulator which modulates an optical signal from an external light source by using electro-optical effect or thermo-optic effect.

According to this exemplary embodiment, since the inter-chip connection module 728 is equipped with the high-sensitive photodetector 700, it is possible to improve the performance of the inter-chip connection module 728.

The present invention is not limited to the above-mentioned exemplary embodiments, can be variously modified within the scope of the invention described in the claims. It goes without saying that these modifications are also included in the scope of the invention.

This application is based upon and claims the benefit of priority from Japanese Patent Application No. 2010-161707, filed on Jul. 16, 2010, the disclosure of which is incorporated herein in its entirety by reference.

The whole or part of the exemplary embodiments disclosed above can be described as, but not limited to, the following supplementary notes.

(Supplementary note 1) A photodetector comprising a substrate, a lower cladding layer arranged on the substrate, an optical waveguide arranged on the lower cladding layer, an intermediate layer arranged on the optical waveguide, a optical absorption layer arranged on the intermediate layer, a pair of electrodes arranged on the optical absorption layer, and wherein the optical absorption layer comprises a IV-group or III-V-group single-crystal semiconductor, and the optical absorption layer absorbs an optical signal propagating through the optical waveguide.

(Supplementary note 2) The photodetector according to supplementary note 1, wherein the optical absorption layer comprises $Si_xGe_{1-x}$ (0≤x≤1).

(Supplementary note 3) The photodetector according to supplementary note 1 or 2, wherein only an edge portion of the optical absorption layer is arranged on the optical waveguide interleaved with the intermediate layer.

(Supplementary note 4) The photodetector according to any one of supplementary notes 1, 2 and 3, wherein an edge portion of the optical waveguide has a taper structure, and the edge portion is arranged under the optical absorption layer interleaved with the intermediate layer.

(Supplementary note 5) The photodetector according to any one of supplementary notes 1, 2, 3 and 4, wherein a $Si_yGe_{1-y}$ (0≤y≤1, y≠x) layer is arranged on the optical absorption layer.

(Supplementary note 6) The photodetector according to any one of supplementary notes 1, 2, 3, 4 and 5, wherein the optical waveguide is made of Si.

(Supplementary note 7) The photodetector according to any one of supplementary notes 1, 2, 3, 4, 5 and 6, wherein the photodetector is an MSM type photodiode or a PIN type photodiode.

(Supplementary note 8) An optical communication device, comprising the photodetector according to any one of supplementary notes 1, 2, 3, 4, 5, 6 and 7.

(Supplementary note 9) A method for making a photodetector comprising, making a crystal grow on a growth underlayer in a first element which comprises a substrate, a lower cladding layer arranged on the substrate, an optical waveguide arranged on the lower cladding layer, an intermediate layer arranged on the optical waveguide, and the growth underlayer arranged on the substrate, to a direction nearly vertical to the growth underlayer, after the grown crystal having reached the height of the intermediate layer, forming a optical absorption layer on the intermediate layer by making a crystal grow to a direction nearly parallel to a surface of the intermediate layer, and forming a pair of electrodes on the optical absorption layer.

(Supplementary note 10) The method for making a photodetector according to supplementary note 9 comprising, forming a lower cladding layer on the substrate, forming a semiconductor layer on the lower cladding layer, and forming the optical waveguide and the growth underlayer by etching the semiconductor layer, and preparing the first element.

(Supplementary note 11) The method for making a photodetector according to supplementary note 9 or 10, wherein the optical absorption layer is one of IV-group and III-V-group semiconductor comprising one of a single-crystal structure, a polycrystalline structure, and an amorphous structure.

(Supplementary note 12) The method for making a photodetector according to supplementary note 9 or 10, wherein one of IV-group and III-V-group semiconductor comprising one of a single-crystal structure, a polycrystalline structure, and an amorphous structure is used in the growth underlayer.
(Supplementary note 13) The method for making a photodetector according to supplementary note 11, wherein the optical absorption layer has a single crystal structure.
(Supplementary note 14) The method for making a photodetector according to any one of supplementary notes 9, 10, 11, 12 and 13 comprising, removing the growth underlayer and the crystal formed on the growth underlayer, after forming the optical absorption layer on the intermediate layer.
(Supplementary note 15) The method for making a photodetector according to any one of supplementary notes 9, 10, 11, 12, 13 and 14, wherein the crystal is formed using the chemical vapor deposition method.
(Supplementary note 16) A method for making an optical communication device, comprising forming an optical communication device using the photodetector made by the method for making a photodetector according to any one of supplementary notes 9, 10, 11, 12, 13, 14 and 15.

FIELD OF INDUSTRIAL APPLICATION

The present invention is applied to a photodetector, an optical communication device equipped with the same, a method for making the photodetector, and a method for making the optical communication device.

DESCRIPTION OF THE CODES

100, 150, 200, 300, 400, 500, 600, 700 photodetector
101, 201, 301, 401, 501 optical waveguide
102, 202, 302, 502 optical absorption layer
103, 203, 303, 503 electrodes
104, 204, 304, 504 substrate
105, 205, 305, 505 lower cladding layer
106, 206, 306, 506 intermediate layer
107, 207, 307, 507 upper cladding layer
108 p-type semiconductor
109 n-type semiconductor
110 p-electrode
111 n-electrode
113, 213 growth underlayer
114, 214 longitudinal growth semiconductor layer
115 semiconductor layer
316 optical signal
417 taper structure
518 $Si_yGe_{1-y}$ ($0 \le y \le 1$, $y \ne x$) layer
620 lens
621 electric wiring
622 pre-amplifier IC
623 chip carrier
624 optical fiber
626 module case
728 inter-chip connection module
729 LSI package
730 electric wiring via for modulation
731 VCSEL light source
732 electric wiring via for photodiode
733 light source and electric wiring layer for modulation
734 optical signal output fiber
735 first mounting board
736 concave mirror
737 second mounting board
738 electric wiring layer for photodiode
739 optical signal input fiber

The invention claimed is:
1. A photodetector comprising:
a substrate;
a lower cladding layer arranged on the substrate;
an optical waveguide arranged on the lower cladding layer;
an intermediate layer arranged on the optical waveguide;
a optical absorption layer arranged on the intermediate layer;
a pair of electrodes arranged on the optical absorption layer, and
wherein the optical absorption layer comprises a IV-group or III-V-group single-crystal semiconductor, and the optical absorption layer absorbs an optical signal propagating through the optical waveguide.

2. The photodetector according to claim 1, wherein the optical absorption layer comprises $Si_xGe_{1-x}$ ($0 \le x \le 1$).

3. The photodetector according to claim 1, wherein only an edge portion of the optical absorption layer is arranged on the optical waveguide interleaved with the intermediate layer.

4. The photodetector according to claim 1, wherein an edge portion of the optical waveguide has a taper structure, and the edge portion is arranged under the optical absorption layer interleaved with the intermediate layer.

5. An optical communication device, comprising the photodetector according to claim 1.

6. A method for making a photodetector comprising:
making a crystal grow on a growth underlayer in a first element which comprises a substrate, a lower cladding layer arranged on the substrate, an optical waveguide arranged on the lower cladding layer, an intermediate layer arranged on the optical waveguide, and the growth underlayer arranged on the substrate, to a direction nearly vertical to the growth underlayer;
after the grown crystal having reached the height of the intermediate layer, forming a optical absorption layer on the intermediate layer by making the crystal grow to a direction nearly parallel to a surface of the intermediate layer; and
forming a pair of electrodes on the optical absorption layer.

7. The method for making a photodetector according to claim 6, further comprising:
forming a lower cladding layer on the substrate;
forming a semiconductor layer on the lower cladding layer; and
forming the optical waveguide and the growth underlayer by etching the semiconductor layer, and preparing the first element.

8. The method for a photodetector according to claim 6, wherein the optical absorption layer is one of IV-group and III-V-group semiconductor comprising one of a single-crystal structure, a polycrystalline structure, and an amorphous structure.

9. The method for making a photodetector according to claim 8, wherein the optical absorption layer has a single-crystal structure.

10. A method for making an optical communication device, comprising:
forming an optical communication device using the photodetector made by the method for making a photodetector according to claim 6.

11. The photodetector according to claim 2, wherein only an edge portion of the optical absorption layer is arranged on the optical waveguide interleaved with the intermediate layer.

12. The photodetector according to claim 2, wherein an edge portion of the optical waveguide has a taper structure, and the edge portion is arranged under the optical absorption layer interleaved with the intermediate layer.

13. The photodetector according to claim 3, wherein an edge portion of the optical waveguide has a taper structure, and the edge portion is arranged under the optical absorption layer interleaved with the intermediate layer.

14. An optical communication device, comprising the photodetector according to claim 2.

15. An optical communication device, comprising the photodetector according to claim 3.

16. An optical communication device, comprising the photodetector according to claim 4.

17. The method for a photodetector according to claim 7, wherein the optical absorption layer is one of IV-group and III-V-group semiconductor comprising one of a single-crystal structure, a polycrystalline structure, and an amorphous structure.

18. A method for making an optical communication device, comprising:
   forming an optical communication device using the photodetector made by the method for making a photodetector according to claim 7.

19. A method for making an optical communication device, comprising:
   forming an optical communication device using the photodetector made by the method for making a photodetector according to claim 8.

20. A method for making an optical communication device, comprising:
   forming an optical communication device using the photodetector made by the method for making a photodetector according to claim 9.

* * * * *